US007135890B2

(12) United States Patent
Chang

(10) Patent No.: US 7,135,890 B2
(45) Date of Patent: *Nov. 14, 2006

(54) SCL TYPE FPGA WITH MULTI-THRESHOLD TRANSISTORS AND METHOD FOR FORMING SAME

(75) Inventor: Augustine W. Chang, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/827,786

(22) Filed: Apr. 19, 2004

(65) Prior Publication Data

US 2005/0231237 A1    Oct. 20, 2005

(51) Int. Cl.
*H03K 19/00*    (2006.01)
(52) U.S. Cl. .......................... 326/101; 326/38; 326/47; 326/41
(58) Field of Classification Search ............ 326/37–47, 326/101–103
See application file for complete search history.

(56) References Cited

U.S. PATENT DOCUMENTS 6,242,945 B1 * 6/2001 New ............................ 326/39

2005/0146352 A1 * 7/2005 Madurawe ................... 326/41

* cited by examiner

*Primary Examiner*—Anh Q. Tran
(74) *Attorney, Agent, or Firm*—Sawyer Law Group LLP

(57) ABSTRACT

A new scheme of Schottky FPGA (SFPGA) IC solution is proposed. The chip is organized by embedded analog, memory, and logic units with on chip apparatus and software means to partitioning, altering selected portions of hardware. The process means is based on the combined Schottky CMOS (SCMOS, U.S. Pat. No. 6,590,800) and Flash technology. The circuit means is based on SCMOS-DTL gate arrays. Software means is based on the C++ procedures with levels of LUT. The SFPGA device supports GHz low power ASIC mixed signal product applications with embedded analog, logic, and memory array units. Several multiplexing schemes are disclosed, which accommodate tasks to vary the Vt and transmission line transmission of selected transistor or IO nets, and therefore their analog and digital device properties. A voltage doubler and supply booster and a Digital-Analog-Digital-Translator (DADT) apparatus are also disclosed in accordance with the present invention.

Accordingly, the present invention includes control schemes to field program basic circuit element or any critical nets, and to alter the functionality of certain predetermined circuit units, and update array interconnections, accessing stored protocols, algorithms in all chips in the embodiment subsystem of a SFPGA chip sets.

45 Claims, 15 Drawing Sheets

System architecture of SFPGA and MLC Arrays

Device and Circuit Architecture for SCL type FPGA with Variable Threshold Transistors

Fig. 2 VTL Device & Processes
Schematic Views of critical device profiles
- Integrated Schottky-CFET cross sectional view
- *SBD special:* Anode implant block out, barrier metal, and Cathode bulk resistance implant
Chip 50
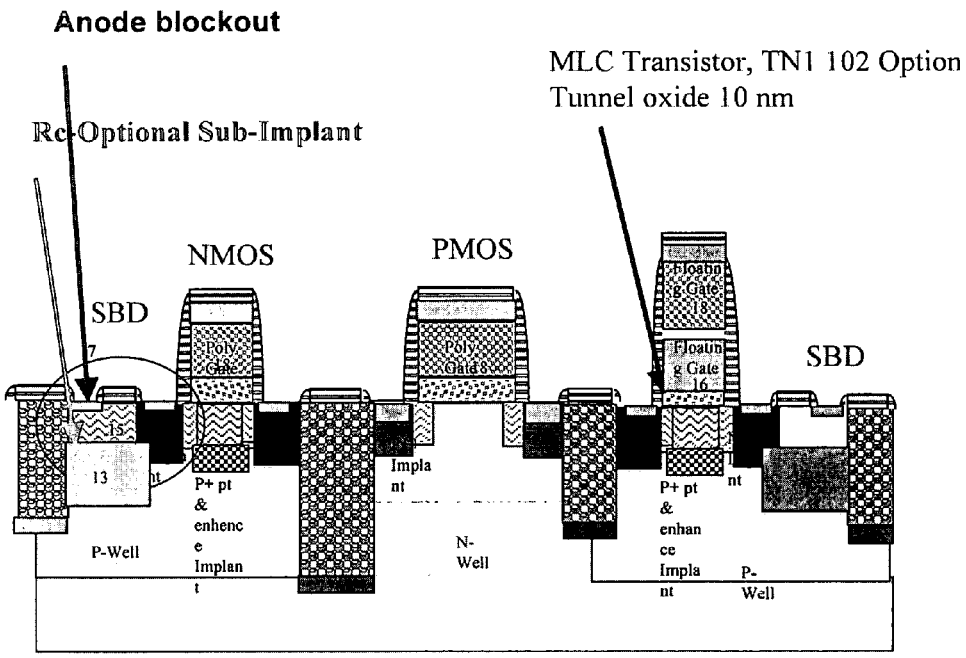
*Standard processes:* Conventional Trench/ROX Isolation, CMOS transistors, and post contact metal processes

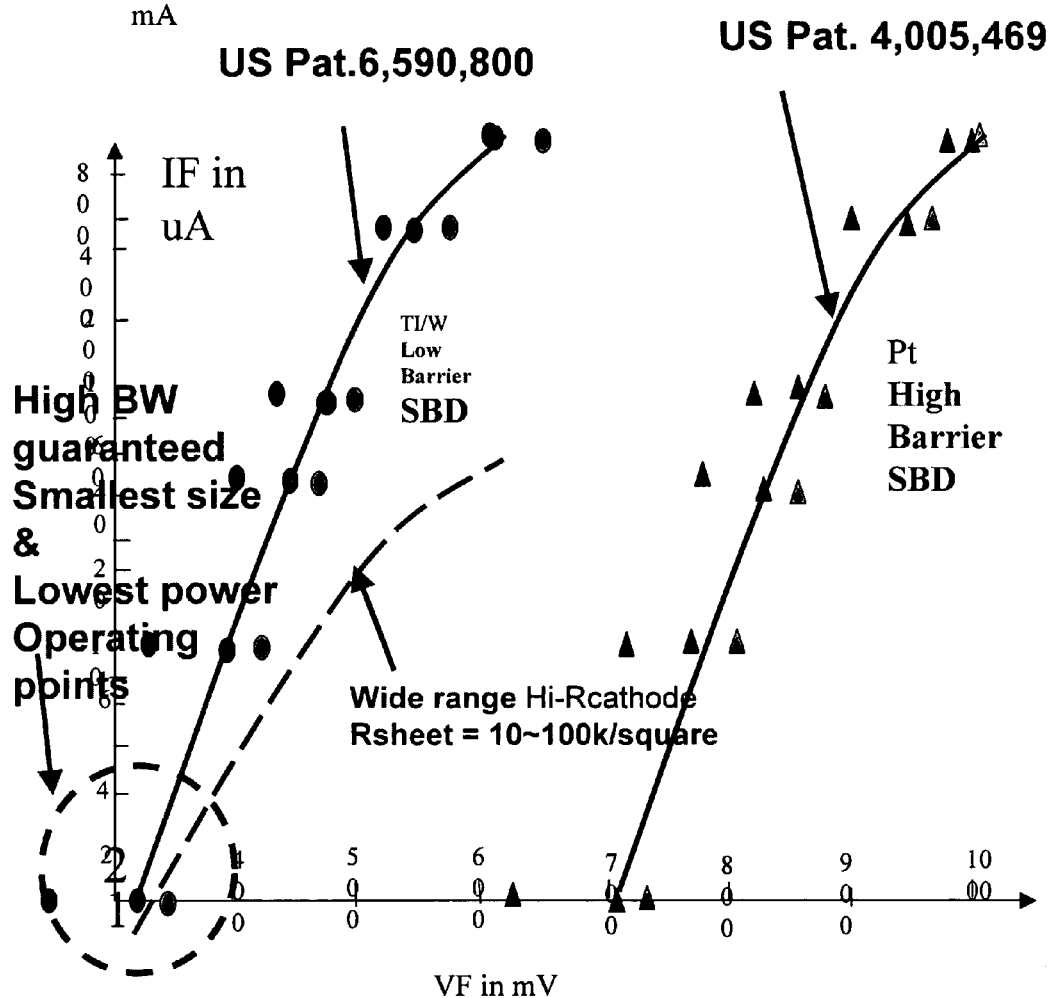
Fig. 3, SBD IF vs VF

Fig. 4
MLC based FPGA, Invention
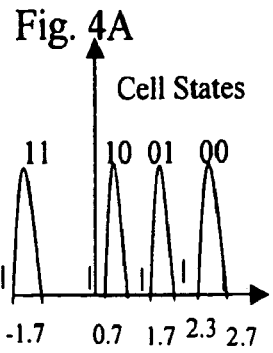
Fig. 4A
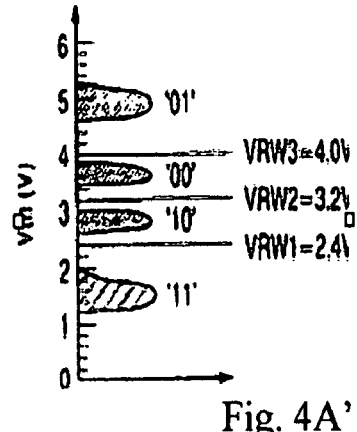
Fig. 4A'
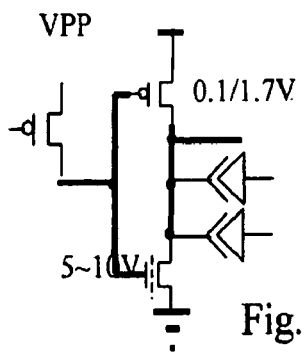
Fig. 4B
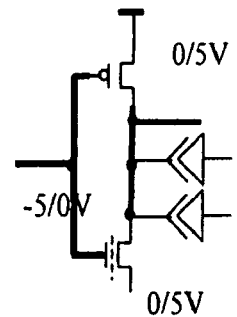
Fig. 4C
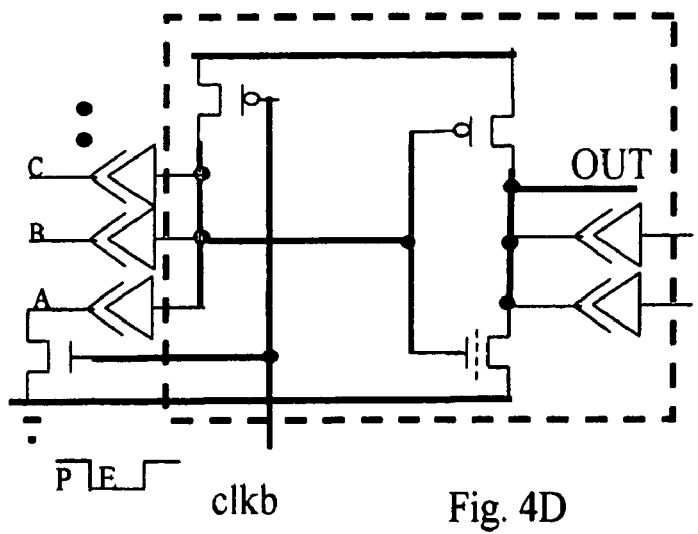
Fig. 4D

Fig. 4
MLC based FPGA, Invention
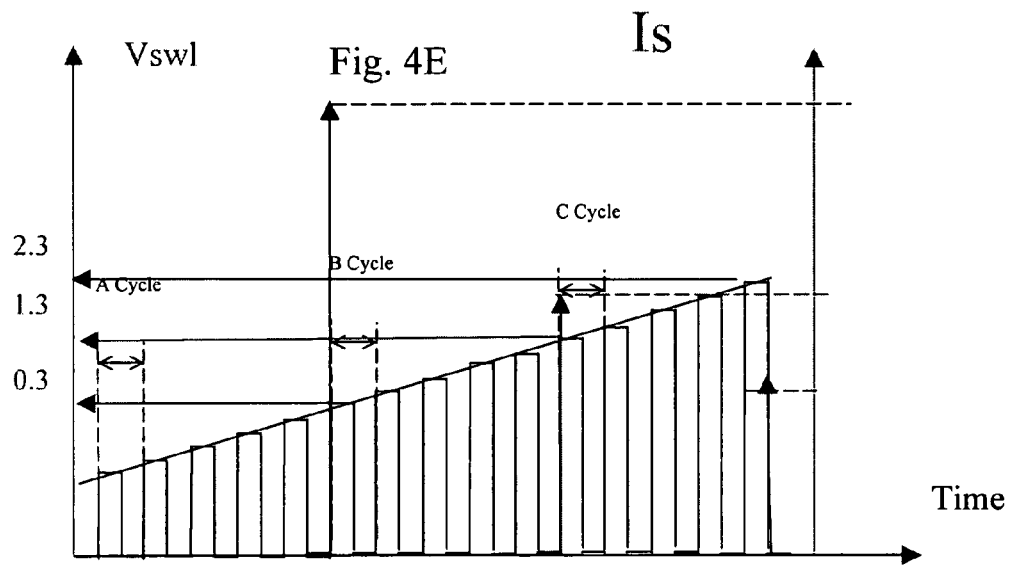
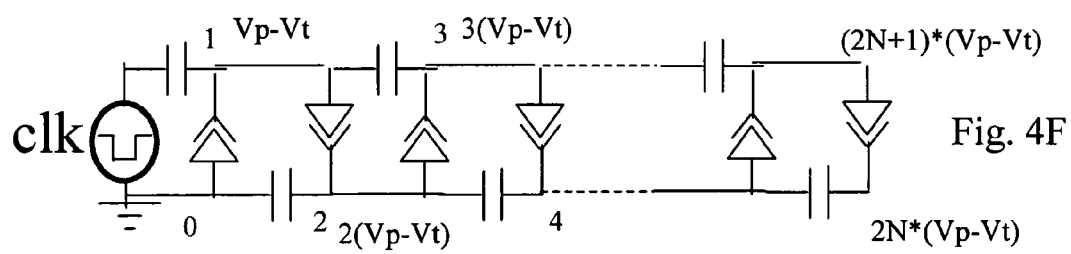
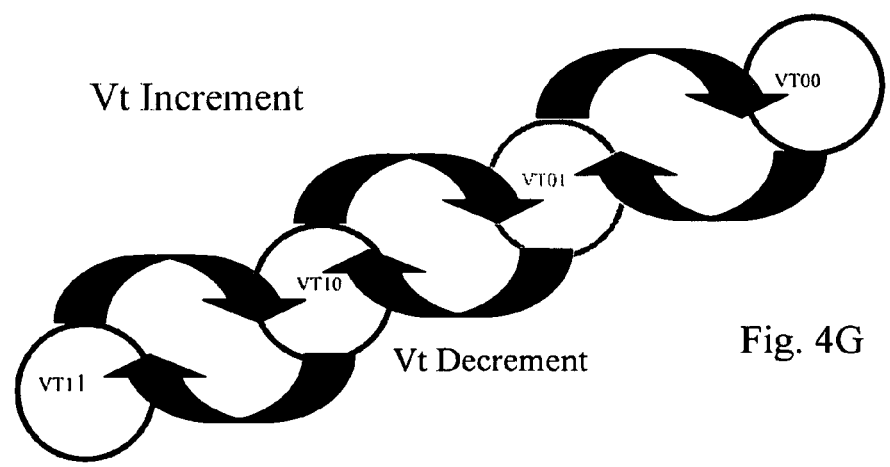

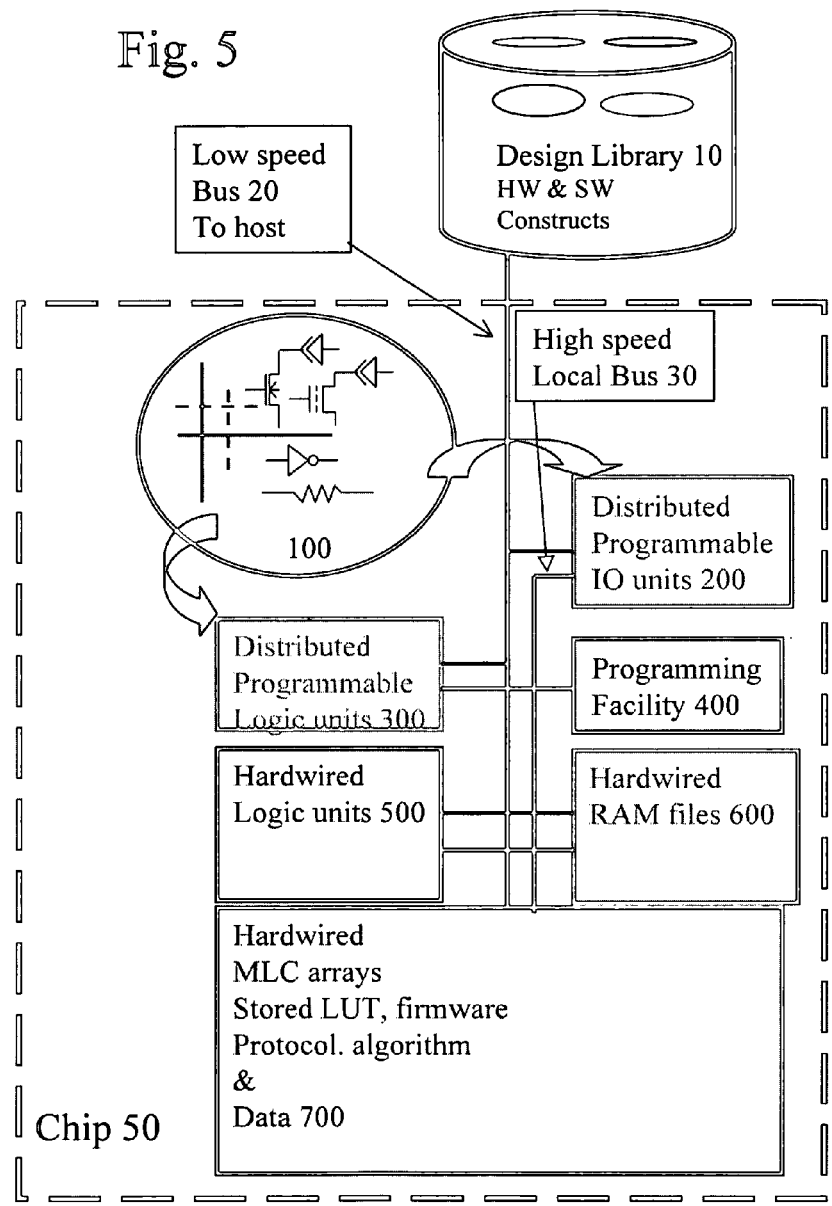
Fig. 5 System architecture of SFPGA and MLC Arrays

SCL FPGA and Flash-FPGA
Prior arts, xilinx 2002, 6,480,954
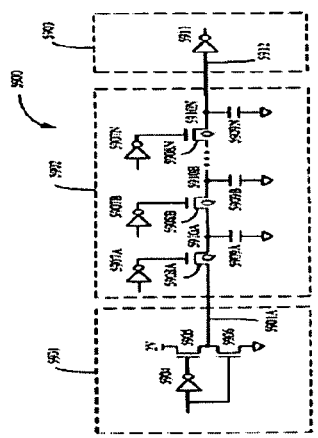
Fig. 6A
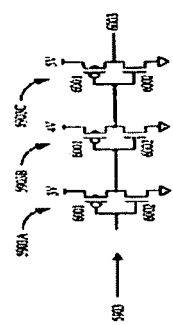
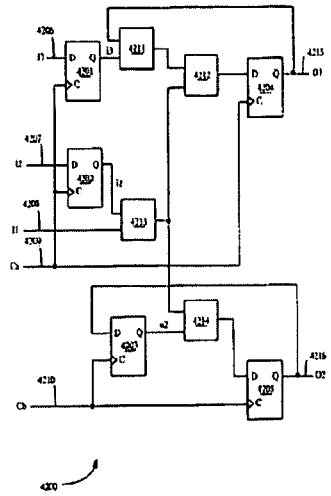
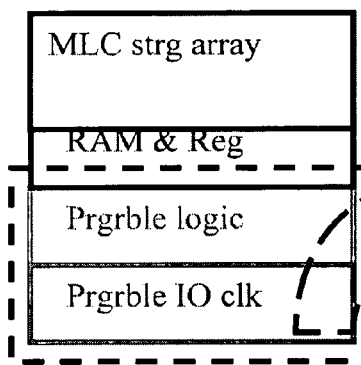
Fig. 6B
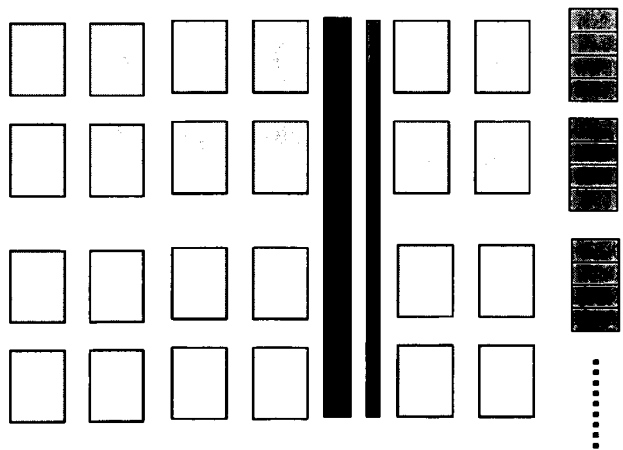

Program the Vt Switch Transistors, Invention
Fig. 7
Fig. 7A
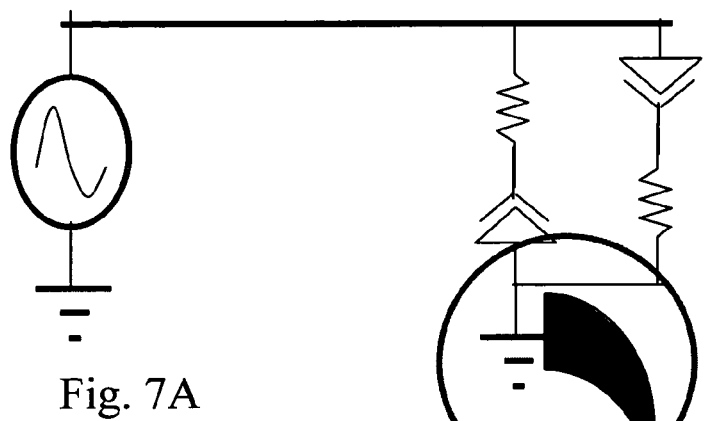
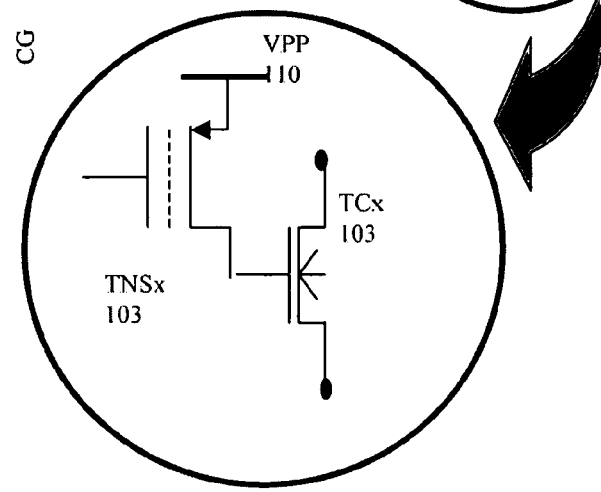

Program the Vt Switch Transistors, Invention

MLC based FPGA, Invention
Prior arts xilinx 2002, 6,480,954

MLC based FPGA, Invention    Fig. 9
Prior arts xilinx 2002, 6,480,954
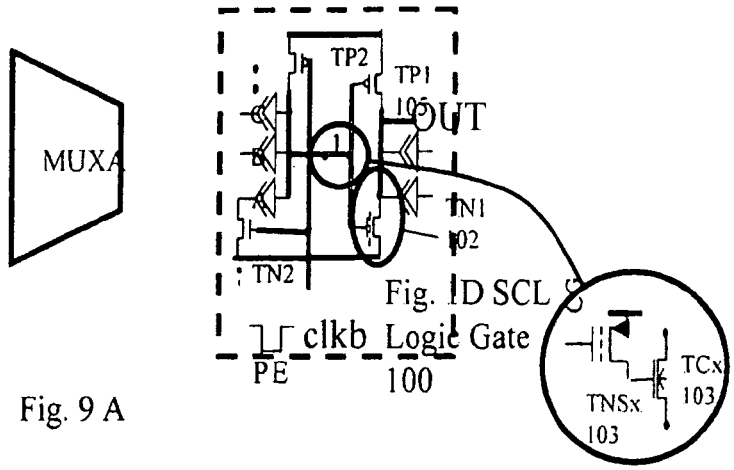
Fig. 9 A
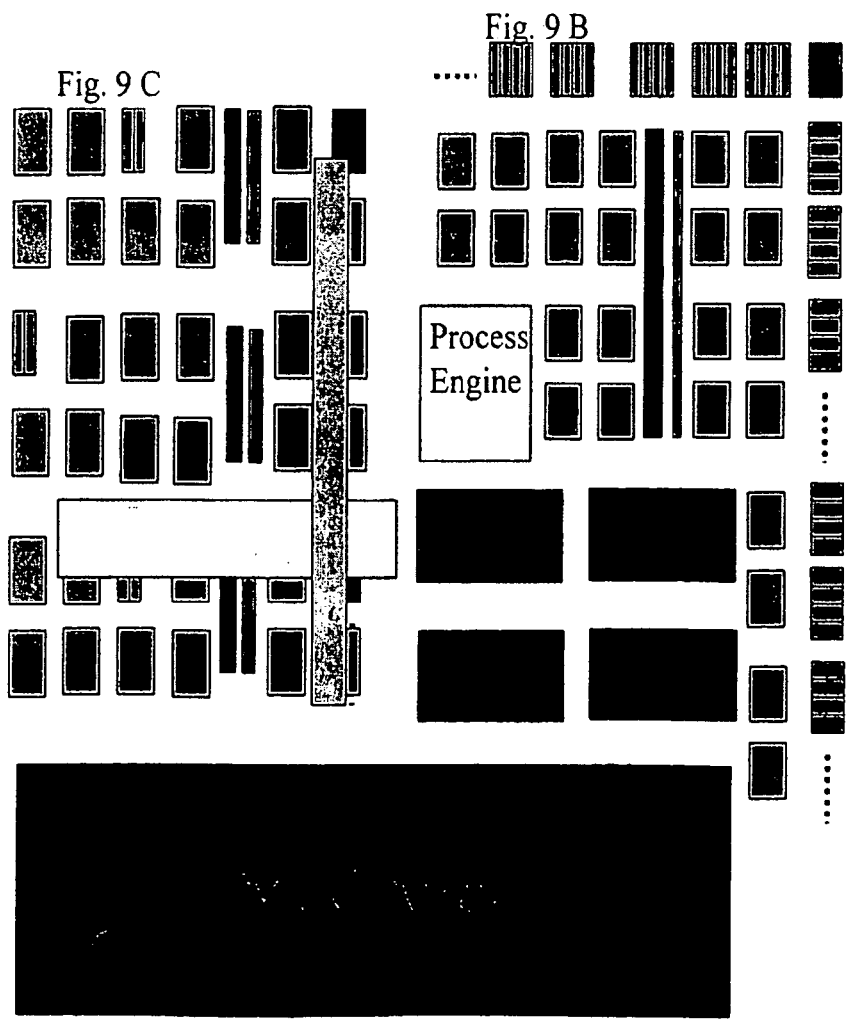
Fig. 9 C
Fig. 9 B

NAND Flash Sense Amp  Fig. 10A
Ref: Samsung 5,768,188 June 16, 1998
- MLC sense Amp Operations
Prgm and Verify
1. Vch=0, 0.3(0.7), 1.3(1.7),
2. MN13 sources Iprm, Iread
3. Vuswl=Vpass = 6V=Vsbl
4. 3 Cycle Pgm, 8 uS intervals
   - Vswl = 14-19 V
5. 2 FF, Fig. 1; 0 = pgm state, 1= inhibit state
Waveforms During PGM
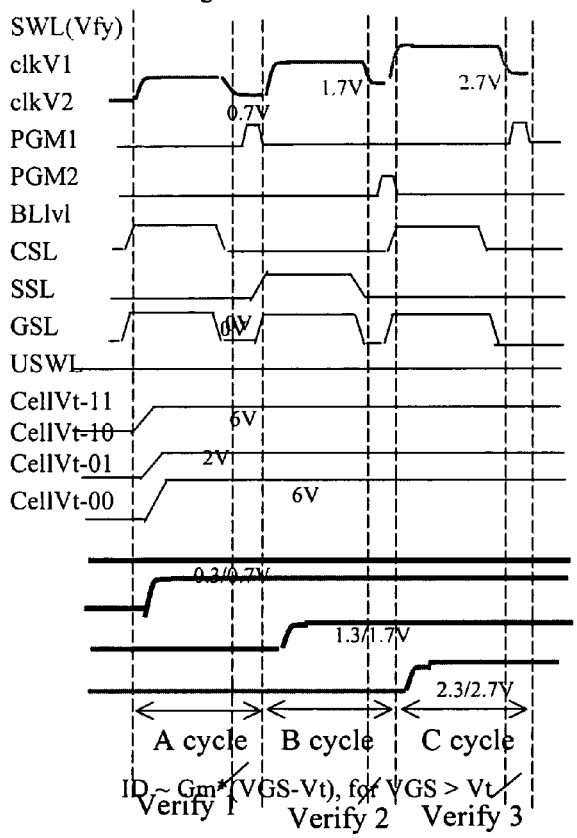
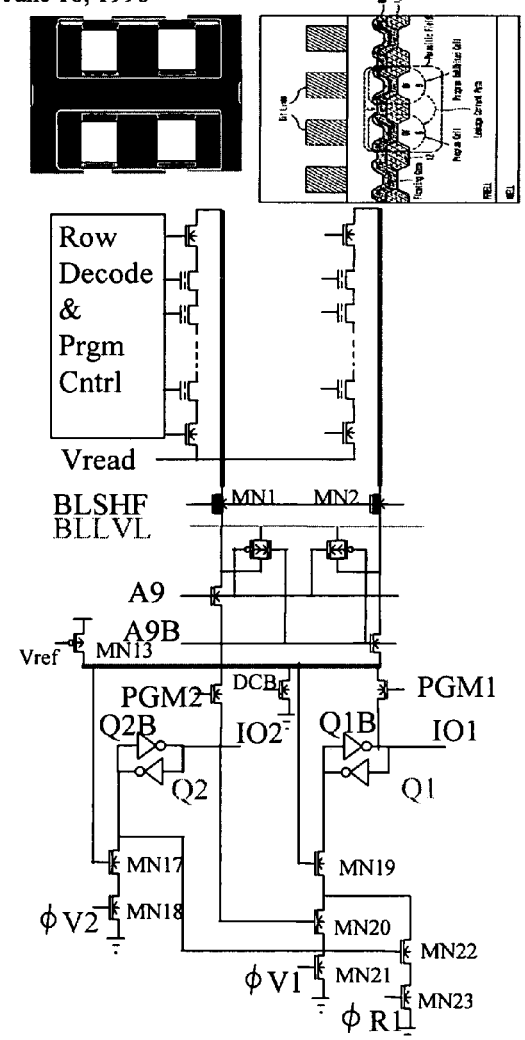

NAND Flash_Sense Amp  Fig. 10B
Samsung 5,768,188 June 16, 1998
- MLC sense Amp Operations
Read
1. USBL=0V from BLLVL, as V-shield.
2. MN13 sources Iread
3. Vuswl=Vpass = 6V=Vsbl
4. 3 Cycle sensing, 8 uS intervals
   - Vswl = 2V(00)>1V(01)>0(10)
5. 2 FF, Fig. 1
- Pulsed controls, Clk1, clk2, clkV1
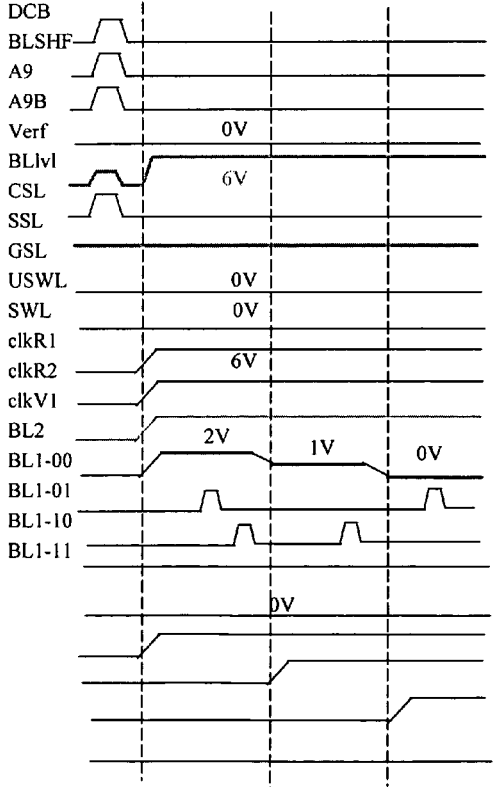
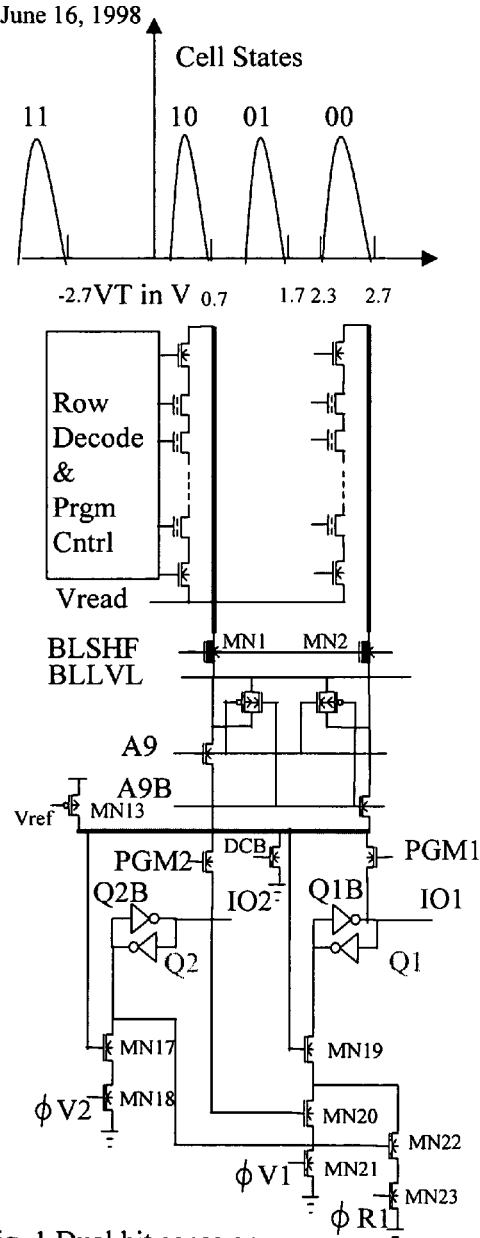
Fig. 1 Dual bit sense amp

Flash-FPGA    Fig. 11
xilinx 2002, 6,480,954

Logical Array Constructs—Configuration Operations
1. Memory cells for Re-configuring CLBs XC4000
   - 5T: 1 pass T+4T latch;
     88-4750,155
     89-4,821,233
   - RAM bit sets 200
     6T RAM cells MC[0:7]
     bit slices from different bit sets support 8 times more dynamic reusable configuration instances
     Reduces functional generators in CLB for LUTs
2. CLB x8 configuration subunits 301
   - Functional generators 302
   - Muxes 305
   - RS controls, initial Value IV, and RSDFFs 322
   - Progmg points 320
   - uRegisters 324
     – uClk 305-321, micro reg., Mux & selector
     – Pipe line latch 350

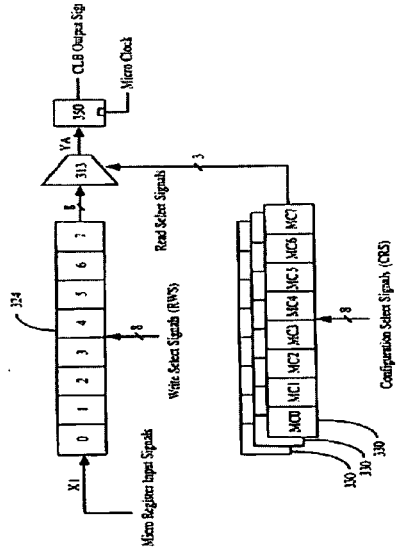
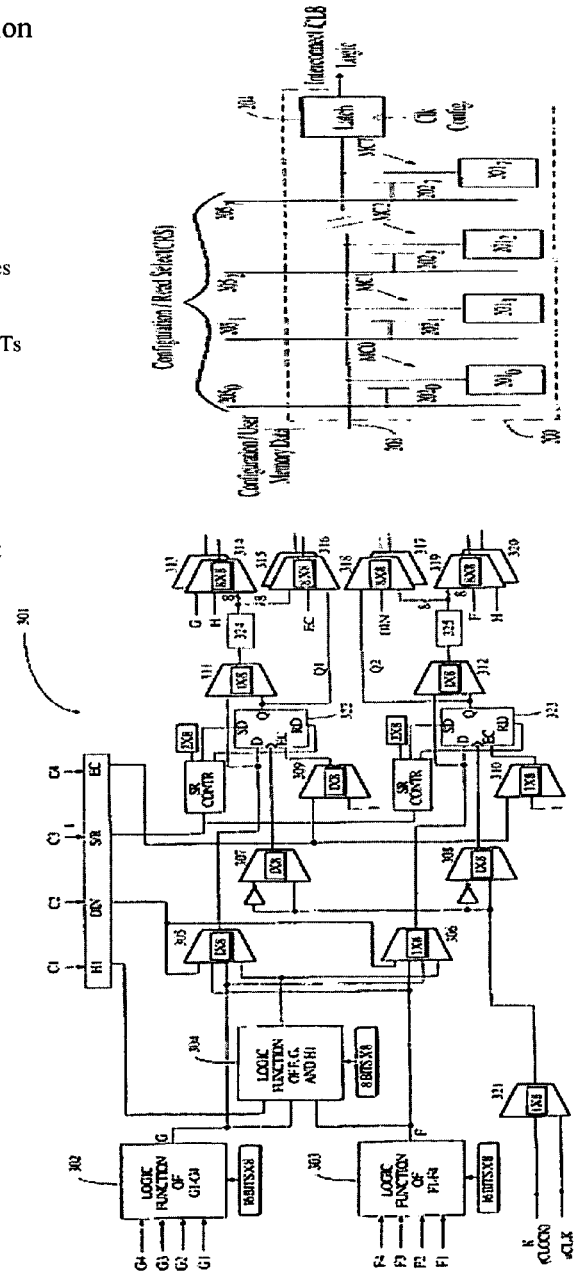

Flash-FPGA Fig. 12
xilinx 2002, 6,480,954

6. Reconfigurations
   Loading new config. data from off-chip w/o resetting the state of the FPGA (live)
   Loaded into RAM slice(s).

7. Single clock sequencer
   - Config. Sequencing is sequentially or with an address.
   - Switch to next config. is by special signal, or by counts of nano-cycles of 200 MHz
   - 3 mode of operations; TS, LE, Static
   - Config. Duration
     - User supplied uClock
     - Fixed delay or counts of ucycles
     - Jump/interrupt logic
   - Synchronous FPGA
     - Triggered by ANDed Uclock
     - PLL and multiplier nclock generation
     - Counter and jump 8. FPGA Mode of operations
   - Time Sharing Fig. 25
     - A multiple of ucycles per Flash reconfiguration., which is triggered by a signal, no predefined sequence.
     - Outputs are stored in micro registers on chip. LUTs
     - CLB performs different functions per Mem slices, greatly increase capacity, up to 80k gates are implemented in a 400 CLB device.
   - Logic engine mode
     1. Sequencing in a predefined way dynamically while alive
     2. Support very large designs in stages. bad sector management.
     3. Each Flash reconfig. is a micro-cycle, one iteration through is a major cycle
     4. Store all LUTs with 5 levels. Fig. 26
     5. The PLD holds 8x more logics then prior arts;
     6. Gain density at some expense in speed.

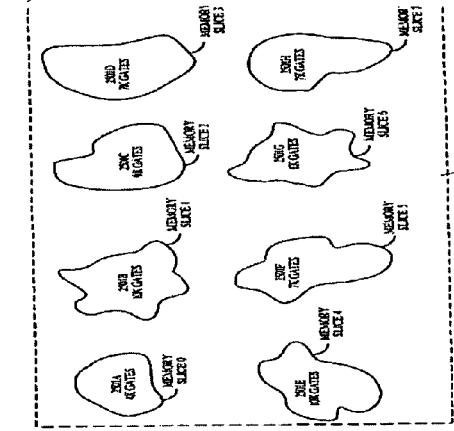

Figure 25

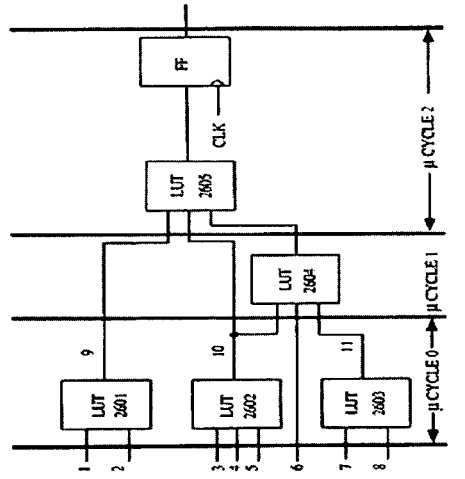

Figure 26

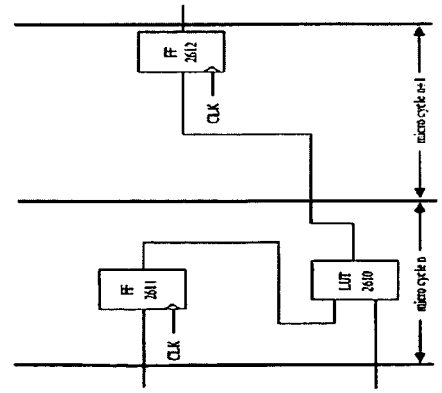

Figure 26B

SCL TYPE FPGA WITH MULTI-THRESHOLD TRANSISTORS AND METHOD FOR FORMING SAME

FIELD OF THE INVENTION

The present invention relates generally to the mixed logic and memory devices in single chip and more particularly to the use of variable threshold transistors for a SCL type field programmable gate array. The concept and examples to organize and implement the device and its functional units as portions of fixed or programmable hardware wiring structures are disclosed.

RELATED APPLICATION

The present invention is related to the copending U.S. patent application entitled "Variable Threshold Transistor for the Schottky FPGA and Multilevel Storage Cell Flash Arrays", Ser. No. 10/817,201 (3065P) filed on Apr. 2, 2004, and assigned to the assignee of the present invention.

BACKGROUND OF THE INVENTION

1. Mixed Signal Circuits for Super IC

The electrical erasable and programmable EEPROM memory has received wide attention in the last decade. Both the technological advances and broad product applications has made it the most emerging candidate for implementing SOC level memory component integrations.

On the process and device technology front, the general practice has been focused on the miniaturization of the physical size of the storage bit, scaling down the cell operating voltages and currents and therefore lowering power consumptions, implementing multilevel signal storages per physical cell area, and building up on chip apparatus to manage per bit, byte, large and partial arrays, resource sharing schemes. The ultimate goals are to achieve the highest level of system integration with mixed analog, memory and logic circuits (AMLC) in a common chip; and therefore to improve IC devices with performance, reliability, system efficiency and capacity.

2. The Densest Cells of any Memory and Logic Arrays in Si

A Flash memory cell, with its multiple bit (2) storage capability in one physical cell layout, is a good choice to implement information storage devices. The density, power, and speed capability of Flash arrays exceed that of rotating disks, so the semiconductor EEPROM is replacing the mechanical disk medium in many applications. The Flash memory cell may also replace DRAM/SRAM if the speed performance is improved besides its superior property of being nonvolatile and having a density of multi-level per cell for information storage. However, little work was developed to employ the FLASH technology to logic applications. Some work was reported to use the EEPROM as switch to wire or reconfigure circuits in a FPGA design methodology. Altera and Xilinx offer field programmable chips to interconnect various CMOS hardware constructs to form complex circuit functions. The standalone FPGA devices support re-configurable control functions that are easy to change with instant deliverable parts.

Accordingly, what is needed is a system and method for providing a field programmable gate arrays (FPGA) which overcomes the above-identified problems. The present invention addresses such a need.

SUMMARY OF THE INVENTION

An IC solution utilizing mixed FPGA and MLC arrays is proposed. The process technology is based on the Schottky CMOS devices comprising of CMOS transistors, low barrier Schottky barrier diode (SBD), and multi-level cell (MLC) FLASH transistors. Circuit architecture are based on the pulsed Schottky CMOS Logic (SCL) gate arrays, wherein a variable threshold NMOS transistor may replace the regular switching transistor. During initialization windows, existing FPGA programming techniques can selectively adjust the Vt of the switching transistor, re-configure the intra-connections of the simple SCL gates, complete all global interconnections of various units. Embedded hardware arrays, soft macro constructs in one chip, and protocols are parsed.

The Variable Threshold transistors thus serve 3 distinctive functions. It acts as an analog device to store directly nonvolatile information in SCL gates. It couples the diode tree logic functions. Finally, it stores and operates large amount of information efficiently. The mixed SCL type FPGA and MLC storages shall emerge as the most compact logic and memory arrays in Si technology. Low power, high performance, and high capacity ICs are designed to mix and replace conventional CMOS-TTL circuits. The idea of multi-value logic composed of binary, ternary, and quaternary hardware and firmware is also introduced.

BRIEF DESCRIPTION OF THE DRAWINGS

FIG. 2 shows all critical device structures of the SCMOS technology, which supports current invention.

FIG. 3 shows the SBD I-V curve used to implement low power logics.

FIG. 4A and FIG. 4A' show prior art schemes of the Vt distributions of the programmable switching transistor TN 102 (Samsung and Hitachi prior arts).

FIGS. 4B and 4C show the programming and erasing conditions in one embodiment.

FIG. 4D shows the configuration of a programmed SCL NAND circuit.

FIGS. 4E–4G show Vt reference device I-V transfer chart during programming cycles, on-chip supply voltage multiplier circuit, and the state-transition diagram of the programmable switching transistor.

FIG. 5 shows a typical functional block diagram and implementation constructs of a chip set part using present invention.

FIG. 6A shows a prior art CMOS-TTL based FPGA.

FIG. 6B. shows the formation of mixed Analog-Logic-Memory (ALM) constructs.

FIG. 7 shows two implementations of the multiplexing (MUX) function and an on-chip transmission line termination scheme of this invention.

FIG. 7A shows a transmission termination scheme for high speed GHz range PCB nets.

FIG. 9, FIG. 10A and FIG. 10B show a prior art and a preferred invention embodiment of a MLC sense amplifier circuit design.

FIG. 9A shows the process of programming a NAND block.

FIG. 9B shows a form factor to layout IO blocks, using all IO around the edges.

FIG. 9C shows a form factor to layout IO blocks, using scattered IO blocks.

FIG. 11 and FIG. 12 show a prior art FPGA implementation of complex functions by nesting levels of LUT and feedback micro registers.

DETAILED DESCRIPTION

Figure 1A:
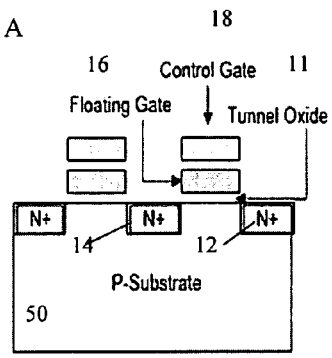
FIG. 1A shows a typical embodiment of prior art implementations of a multilevel Vt transistor as a storage cell in a MLC Flash array.

The present invention relates generally to the mixed logic and memory devices in single chip and more particularly to the use of variable threshold transistors for a SCL type field programmable gate arrays. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

1. The Variable Threshold Transistor for VTL and MLC Arrays

A device process, circuit, and system architecture of combined FPGA and EEPROM mass storage techniques in accordance with the present invention that supports both the variable threshold logic (VTL) array and multi-level storage cell (MLC) array implementations in a common substrate. Both the conventional CMOS transistor and the MLC transistor are utilized directly to implement generic binary logic functions. Besides these critical functions, the variable threshold transistor may serve as storage element, analog comparator, and multi-value logic defined by ternary and quaternary algebraic operators.

Unlike conventional binary logic, which was based on CMOS-TTL circuit architecture, the principle of pulsed SCMOS-DTL that was fully disclosed in U.S. Pat. No. 6,590,800 and in the copending U.S. patent application entitled, "Variable Threshold Transistor for the Schottky FPGA and Multilevel Storage Cell Flash Arrays," serial no. (3065P), filed on Apr. 2, 2004 is utilized. In the '800 patent, the SCMOS-DTL circuit was based on conventional transistors with fixed threshold (~0.7V).

Here the SCMOS process technology is further extended to include MLC (Flash) transistor. The SCL layouts are not only hardwired, but can be reconfigured as a nonvolatile soft macro. Additionally, the switch transistor TN1 101 may use an option to replace it with a variable Vt transistor (FIG. 1D, TN1 102, basically a MLC cell element) making it field programmable by selectively adjusting stored charges, during the initialization cycles, in its floating gate.

Armed with this powerful flexibility, the SCMOS process technology becomes perfect to support a wide range of product and circuit applications. The embodied circuit constructs in this article will enable the erasing and programming operations for any selected switching transistor(s) TN1 101 or control switches TN1 102. Furthermore, by placing programmable nonvolatile-switches TNSx 103 or RAM bit to drive pass transistors (TCx 103), the simple SCL circuits with pre-assembled wiring resources can be reconfigured or reused. Stored software constructs will perform routing and wiring to complete all individual circuit units by assigning and reassigning tracks, pass transistors TCx, nonvolatile control switches TNSx, or RAM bits in a block-by-block sequence. Skilled engineers may further interconnect group by group the placement and routing of large array blocks and all functional units with the pre-allocated global wiring resources.

While the emerging SCL techniques are compatible with conventional CMOS-TTL techniques, signals in different parts of the mixed circuits are allowed to interface with each other. By attaching an integrated diode to the NMOS source/drain node, the two types of circuits, with matched level shifting, can communicate with each other. In ASIC chip set designs, the SCL circuits, for its efficient advantages in space, power and speed, then become superset implementations to compliment the CMOS-TTL solutions. Nevertheless, the SCL circuits also are aimed at more compact layout, and it delivers better power-speed product and works well with lower voltage supply (1.2V). With this background, the SCL type of FPGA outperforms conventional CMOS-TTL and standalone FPGA solutions by, 1. Combining highest density logic and memory array units in a single chip, 2. Offering field programming capability to generic logic units, 3. Providing both volatile and nonvolatile logic circuitries, 4. Providing direct analog-digital bi-directional signal translations, 5. Allowing mixed TTL and DTL circuit interfaces, 6. Consuming the least power, 7. Increasing special capacity, 2. The SCL Cells and MLC Cells Review It is the object of the present invention is to mix the MLC storage arrays with the SCMOS based Schottky CMOS-DTL Logic (SCL) arrays on the same chip. Another object is to mix the hardwired implementations with the field programmable so that the cost and flexibility are compromised. Still another object is to implementing schemes allowing space and time multiplexing of the MLC transistor in a SCL circuit. By reconfiguring a MLC transistor in a SCL switch transistor, certain physical device units are augmented to serve three distinctive roles; analog signal comparator, digital logic gating, and nonvolatile signal storage element. Still another object is to support special features (On chip transmission line termination, for instance) of certain circuit units such that performance is optimized. Still another object is to develop multi-value logic (MVL) circuit implementations. The MVL, a separate invention prosecution by the author, involves hardware and firmware supported arithmetic operations. Powerful ternary and quaternary logic circuits, algorithms, and algebraic operators are exemplarily implemented. The capacity and efficiency of information access and process are greatly improved beyond the same supported by conventional binary circuits and Boolean algebra.

Figure 1B:
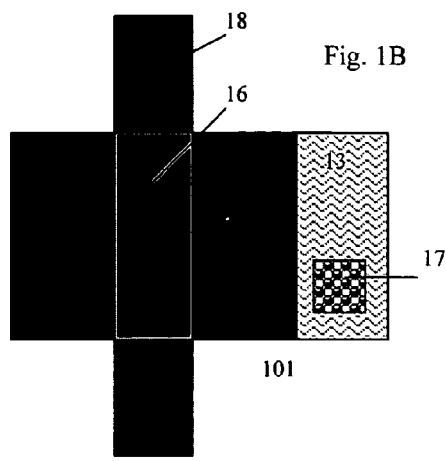
FIG. 1B shows the horizontal layout of the simplified VTL switching transistor TN1.
Figure 1C:
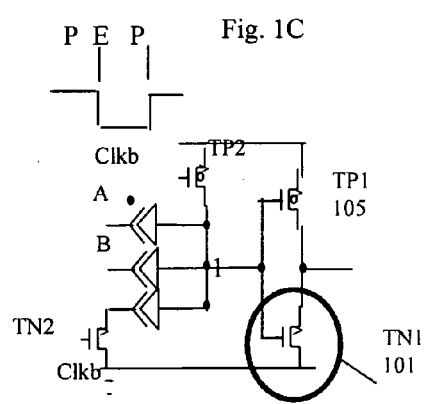
FIG. 1C is the schematic diagram of prior art SCMOS DTL logic NAND gate using fixed Vt NMOS transistor TN1.

There are many prior arts of making MLC flash array cells and logic units. In most systems today, the Flash parts are standalone IC or modules separated from the logic parts. The techniques to employ a MLC or variable Vt transistor for FPGA hardware constructs are disclosed herein. A conventional embodiment of prior art implementation is illustrated in FIG. 1A. The SCL circuits FIG. 1C are comprised of SBD diode tree, which is powered by an asynchronous dynamic clock transistor pair, followed by a CMOS inverter(s). FIG. 2 shows all critical device element profiles in one chip 50. The SBD I-V curves are shown in FIG. 3. The SCL circuits are usually hardwired for performance and area compactness reasons. During the reconfiguration procedures, in the FPGA units, before wiring the selected circuit unit, it is necessary only to adjust the Vt of the NMOS transistors (TN1 102, FIGS. 1D~1E) of the first stage inverter. Both of the source and drain regions, common gate node 1, are reachable at first metal layer for reconfigurations.

The reconfiguration procedure may repeatedly arrange portions of local and global metal and thin film tracks, pass transistors TCx, TNSx, and other RAM bits applying biasing conditions from dedicated on-chip facility blocks (FIG. 5, block 400) to the target devices. In one of the embodiments, the programming and erasing conditions are shown in Table 1 below and in FIG. 4b and FIG. 4c respectively.

Table 1 highlights SCL cell erasing and programming operations during POR or reconfiguration cycles for the selected cells.

TABLE 1

Write and Erase conditions for the switching transistor(s) of SCL gates

Programming conditions.

VG = 5~10 V pulses
Vout = 0.7 V (Vmode), or Iout = −100 μA (Imode)
Verify VT = 0.7 V (Default), 1.7 V, 2.7 V
Erase conditions VG = 0/−5 V pulses
Vout = 5/0 V
Verify VT = −1 V with respect to source The Read Write Engine of the SCL Type FPGA (SEPGA)

Figure 1D:
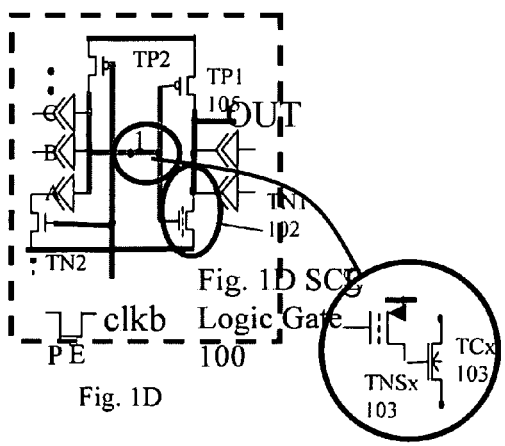
FIG. 1D shows the circuit implementation option wherein the switching transistor in FIG. 1C can be replaced by a Variable Vt transistor TN1.
Figure 1E:
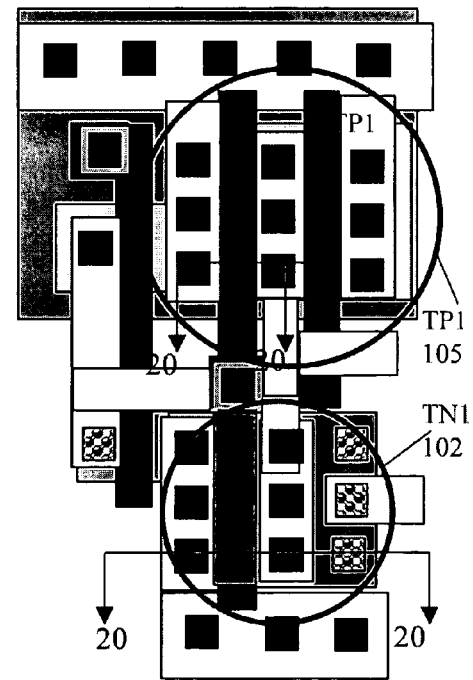
FIG. 1E is the layout representation of the SCL gate employing a Variable VT transistor 102.

The depicted soft macro uses the variable-threshold switching transistor in forming the SCMOS based SCL gate arrays. FIG. 1B shows the horizontal layout of the simplified VTL switching transistor TN1 102. FIG. 1C is the schematic diagram of prior art '800 SCMOS DTL logic gate using fixed Vt (0.7V) NMOS transistor TN1 101. FIG. 1D shows the circuit implementation option wherein the switch transistor can be replaced by a Variable Vt transistor TN1 102. FIG. 1E is the layout representation of the SCL gate employing a Variable Vt transistor.

FIG. 5 depicts an emerging ASIC chip and system design architecture. Chip 50 can be implemented by off-chip design library 10, and pre-allocated wiring tracks, connect switches, soft and hardwired micro-cell constructs. Local hardware constructs are the distributive IO units 200, distributive logic units 300, Programming facility 400, hardwired RAM and ROM 500 arrays including those one time programmable (OTP) by fuse or anti-fuse techniques, and MLC storage arrays 700, which also store the data bits and LUT based software and firmware.

Pre-allocated FPGA resources, shown in FIG. 5 100, are distributed in certain IO and re-configurable logic blocks. In FIG. 6B, mixed Analog-Logic-Memory (ALM) constructs are formed of both the hardwired and soft macros of SCL and conventional CMOS-TTL arrays allowing users to implement the most compact IC solutions with highest speed-power-area efficiency, functional capacity, and flexibility. An exemplary list of hard and soft macros are referred to the copending U.S. patent application entitled "Variable Threshold Transistor for the Schottky FPGA and Multilevel Storage Cell Flash Arrays", serial no. (3065P), filed on Apr. 2, 2004.

On chip facilities 400 are provided to program (erase and write) the MLC arrays and distributed variable Vt transistors (individual cell, byte, word, sector arrays) to the desired threshold level during chip initialization procedures. Suitable local and global wiring tracks are pre-allocated in a master chip (i.e., for intended product applications) to reconfigure selected transistors both to act as the controls (TNSx/RAM bit) to interconnecting switches (FIG. 7A, TCx), and as the switching transistor (FIG. 1D-1E, TN1 102) of the inverter. Suitable chip areas are allocated to support certain portions of hardware as hardwired logic (blocks 500, 600) and storage arrays (700), and another regions support programmable logic units and IO blocks (blocks 200, 300) The skilled designers may drive their-configuration processes by the stored look-up-table (LUT) software and initialization procedures including but not limited to placement and routing tables, algorithms, packet switching protocols, parameters governing collision, error-detection and correction facilities, virtual state machines, logic synthesis procedures, calibration and test bench routines. Better than conventional volatile circuit synthesis, the logic macro function circuits and termination schemes instantiated by the invented variable Vt circuits can remain nonvolatile after power shut down yet are re-configurable when needed.

On chip facilities 400 are provided to program (Erase and write) the MLC and Vt transistors to the desired threshold level during chip initialization procedures. Suitable local and global wiring tracks are allocated to reconfigure selected transistors both as the controls of interconnecting switches and as the switching transistor of the inverter. Suitable chip areas are allocated to support certain portions of hardware as hardwired logic and storage arrays, and another regions support programmable logic units and IO blocks. One can drive the re-configuration processes by the stored LUT software and initialization procedures. The logic circuits and termination schemes once programmed can remain nonvolatile after power shut down yet are re-configurable on the fly.

It is the object of this invention the logical units are formed by the pulsed DTL circuits, which only need Schottky diodes, standard CMOS and variable threshold transistor switches, pass transistors, and power inverters. Since the circuit wiring is much simpler than CMOS-TTL, this new architect usually does not require conventional CMOS-TTL gate cells having more than 2-way inputs. Stacked transistor string is not required as the TTL circuits often do. In SCL, each of the SBD local IO ports occupy only the size of a contact hole to carry channels of logic signals as Fan-in and Fan out. Not only it saves physical space, but more importantly it is low power and faster. The circuit is dc static burning no power. Ac power is prorated by asynchronous pulsed cycles. The logic swing is lowered to 1.2V supply, the nets have lower stray capacitance, and there are no serial transistor paths with biennial RC time constant. In general, parts achieve 50% AC power consumption compared to the same electronics operated at 1.8V supply voltage.

FIG. 4A shows one prior art embodiment of the Vt distribution of the switching transistor TN102, which stores electrical charges that can be quantified in 4 digital levels, or 2 binary bits. The Vt were spreading from depletion mode threshold to three discrete thresholds. FIG. 4A shows another prior art threshold distribution, where depletion mode, which has deficiency in leakage controls, was eliminated. FIGS. 4B and 4C show the biasing conditions applying to the Vt transistor during the programming and erasing operations respectively. FIG. 4D shows a configured SCL NAND circuit. Reference device I-V transfer chart, On-chip supply voltage charge pump circuit, and state-transition diagram of the switching transistors are shown in FIGS. 4E~4G. FIG. 5 shows typical product design block schematics using the invented circuit architecture. Various hardwired and soft macro SCL arrays, MLC arrays are compiled.

Note that the low barrier SBD is highly ideal and efficient in space and conductivity to form clipping circuit compared with conventional way employing a diode configured by three terminal transistor. In FIG. 4F, the diode-capacitor ladder circuit generates all high voltage references nicely along the charge pump chain. The capacitor plates can be formed by the poly gate to bulk terminal as well as using two adjacent poly conducting films isolated by thin (on the order of 3–5 nm) layer of nitride film (high K=7). Each stage will double the base voltage, from band gap reference generator of 1.23V, or the clock, or internal oscillator, offsets at 300 mV steps can be derived either from bottom or top level by chain of SBDs.

It is interesting that as the booster circuit builds up, more stages offer higher and higher voltage reference points. In each section the SBD and C elements do not see more stress but only by one VCC.

The various reference voltages are selected or applied to drive word lines during programming cycles via pass transistors or switches.

It is the object of the invention that fine voltage references are accommodated so that programming controls are optimized, and lower external power supply (1.2V) may be used to support all operation modes. The target specification of maximum high voltage is less than 5V (from 20V). In FIG. 6A, the Xilinx prior arts of the CMOS-TTL based FPGA is shown. The 2V internal supply was used to lower the logic signal swing, and allows overdrive for switch transistors (TCx). Our invented SCL type FPGA not only further reduced the signal level to 1.2V, but provided simplified DTL circuit paths which yielded more powerful and efficient hardwired solutions. This architecture may apply to the standalone chips as well as incorporate them to form a universal IC with mixed ALM macros of various embedded ICs (FIG. 6B). Table II below summarizes key features of the SCL type FPGA.

TABLE II

Logic Cell Operation During POR or Reconfiguration Cycles (Continue)

Binary logical operations

Configurable binary NOR or NAND
Built-in level shifter
Power-speed trade-off
One-Hot signal select MUX
High Fan = in/out logic gates: single stage 20way decode
smallest power, high speed, highest density/capacity
Concurrent SCL and CMOS interfaces
Static zero power TABLE II-continued Logic Cell Operation During POR or Reconfiguration Cycles (Continue)

Other Analog functions

ESD and Daisy Chain terminator (40 ohm GTL)
Sense amps, RF and clipper
Absolute value
Building Blocks/Resources Serial/parallel BUF, XOR & ECC
Reg. RAM, and MLC ROM
CLBs: SCL NOR/NAND
Wiring Resources (not shown)
  Local interconnects
  Local tracks
  Global tracks
IO Blocks run at 1.2 V Schmitt Trigger
Transceiver
ESD and integrated Daisy Chain terminator
PLL and clocks
Advantages Space power efficient; chip and board level
Speed improvement
Higher integration
Flexibility FIG. 7 shows two implementations of the multiplexing (MUX) function and an on-chip transmission line termination scheme of this invention. FIG. 8 shows two schemes to place the MUX gates and two schemes to place IO blocks. Many hardware blocks shown in Table III below can be embedded. FIG. 9A shows the process of programming a NAND block. FIGS. 9B and 9C shows the various portions of embedded embedded hardware are configured.

TABLE III

Building Blocks Resources

Serial/parallel BUF, XOR & ECC
Reg. RAM, and MLC ROM
CLBs: SCL NOR/NAND
Wiring Resources (not shown)
Local interconnects
Local tracks
Global tracks FIG. 10 and FIG. 10B cite several prior art schemes for the charge pump engines to add or remove charges involving the MLC cells. The preferred embodiment is to transport charges by a parallel hardware engine and a software algorithm disclosed by Chang and Chen (the copending U.S. patent application entitled "Flash Device with Multilevel Cells").

FIG. 11 and FIG. 12 showed Xilinx solution of complex FPGA implementations by micro-register files involving MCL switches, nested LUT and MUX constructs built by CMOS-TTL circuits. The SCL FPGA implementations would offer significant improvements as viable alternatives.

Still another application of the present invention lies in the field of logic operation with advanced arithmetic operators and algebra. In a separate invention disclosure, Chang and Kao disclosed method of multi-valued logic operator constructs, which deliver powerful ternary and quaternary arithmetic operations.

There are many prior art and embodiments for manufacturing MLC array cells, which are considered in this invention. However, this is not the focus of the present invention.

The primary emphasis is to expand the application of an MLC transistor to implement useful logic and analog functions beyond its role as a massive storage element.

One can see easily from the circuit schematics and layout art works in FIG. 1C, 1D, 1E that the area and transistor counts is imperatively reduced in the proposed SCL circuits compared with its CMOS-TTL counter parts. This is because of the logic functions are generated by the integrated SBD diode tree instead of the TTL coupling complementary logic. The difference in circuit topology transforms into physical benefits both in space savings of the circuit elements and in over all wiring complexity. It follows that, for the simple SCL circuits, the biasing schemes are significant easier to accommodate. The same is true to reconfigure the switching transistor and to interconnect all intra-circuit nodes. Thus one can conclude that the SCL scheme is a superior choice than TTL scheme to implement FPGA.

In the light of continued physical scale down trend, the transistors are more conductive and would be desirable to be operated in the low power regions with lower applied voltages and current levels. This trend conflicts with self biasing body effects of the TTL scheme but fits SCL circuits perfectly, as it avoids the complicated stacking transistor strings of the CMOS TTL paths but keeps the simplest inverters and passing transistors. Still another drawback for the TTL scheme is that it suffers severely speed degradation to lower supply voltages especially for high Fan-in Fan-out nets.

The new scheme of adjusting Vt of the switching transistor, TN1 102, further safeguards the clamp/logic gating function of the SCL switching transistor when it was original proposed in the '800 patent. When the internal node 1 of the SCL circuit is clamped by the diode during the pre-charging state, the switching transistor is operated in the sub-threshold region. The employment of the variable threshold transistor in the $1^{st}$ stage DTL inverter allows the designer to contain the off-state margins with forward leakage currents to sub-nano-ampere range.

For the sake of simplicity, the case of applying the P-type MLC transistor to replace TP1 105 in FIG. 1C is not addressed since its characteristics would be poorer than the NMOS TN1.

Besides serving as a gating element to pass or block diode tree logics. TN1 102 may act as key element of an analog signal comparator to sample and compare input digital or signals against the stored signal. It is also a multi-level (more than 2 bits) information storage element that holds nonvolatile multiple bits of digital information more compact than implemented by volatile hardwired binary latches.

In the SCL circuits (FIG. 1C, 1D, 1E), logic function is instantiated by the two-phase clock transistor pairs, which either bias the diode tree to generate desired logic function or activate diode clamp. The logic function is further coupled through a simple inventor or chains of inverters for power amplifications. The logic functional constructs can be either hardwired CMOS-DTL (Default Vt of 0.7V) implementations or soft macros subject to designed reconfiguration procedures. It may instantiate Vt for the switching transistor, complete intra and inter block circuit connections among the diode tree, local inverter(s), and remote interfaces. The instantiated circuit unit in at least one of the IO or Logic blocks is shown in FIG. 2-100 and FIG. 5 100. Which comprised of resistors, clock transistors, regular pass transistors TCx 103, variable Vt switching transistor(s) TN1 102, MLC switches TNS 103, local (dashed short bars) and global wiring tracks (long and solid bars).

In one embodiment, the SCMOS device cross-section 50 of the switching transistor the PMOS transistor is highlighted in FIG. 2. The SBD diode (regions 12, 13, 15, 17) is situated in the extension bed of NMOS transistors. The Vt transistor 101 is a optional CMOS transistor with stacked floating gate 16 made of ONO material (NROM Saifun patent here) or buried poly conducting film. The regular NMOS is structured the same except without the floating gate and it has thicker gate oxide. However, it is not the emphasis of the present invention to elaborate the process details of many prior art devices, but simply follows the current state of the arts in combining the SCMOS transistors and MLC transistors. Trench isolation is preferred to prevent lateral latch up action between the NMOS and PMOS gate array transistors and CMP is preferred for multi-layer wiring.

FIG. 3 shows the SBD I-V curves for two types of contact metals (Pt/Al diode and Ti/W diode), which yield cut-in voltage at 0.2~0.3 V range and 0.7 V (Pt silicide diode) respectively. The SBD can be either high barrier or low barrier metal, but the surface concentration of the N- background is around 1e16 atoms/cm3. Deep buried sub-implant or shallow EPI layer is required to achieve low surface concentration. Some SBD works from HP exhibits 0.2V forward drop and leakage was contained under 1 nA at 9V reverse biasing. It was used as line clamp to contain over/undershoots.

Back to the system architecture depicted in FIG. 5, we incorporate embedded sub-system units encompassing Flash 700 and any memory arrays 600 (SRAM, DRAM, mask and OTP ROM), hardwired and soft macro based logic arrays. Low power and novel circuit means are disclosed to implement preferred embodiments at chip and PCB assembly levels. Distributive chip set solutions for USB2+ mass storage sticks and cards based on this architecture with mixed FPGA and MLC chips are disclosed in the copending U.S. patent application (3065P).

Other embedded arrays (DRAM, SRAM, PLA, OTP) can be added to the FPGA and EEPROM chip. We depict the basic structures in the IO block (IOB) or internal logic blocks (ILB), and all bus interfaces between large functional units to be simple in wiring and easy to program with current state of the arts in CAD automatic wiring.

Figures 7B, 7C:
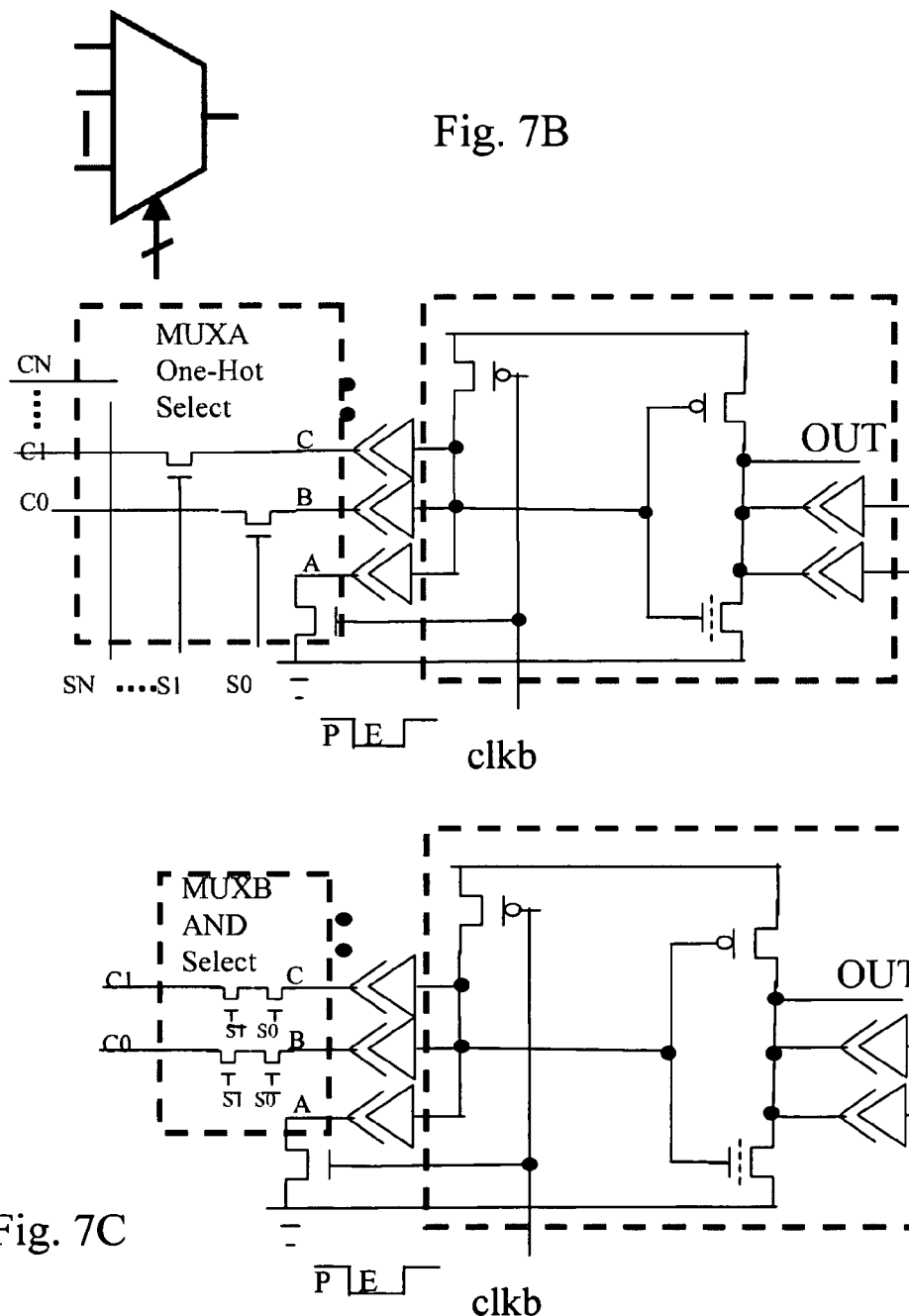
FIG. 7B shows an input mux scheme using One Hot selection for desired logic, Vrefs or analog signals.
FIG. 7C shows another variation where chains of pass transistors act as AND selector to select desired signals to the comparator.
Figure 8:
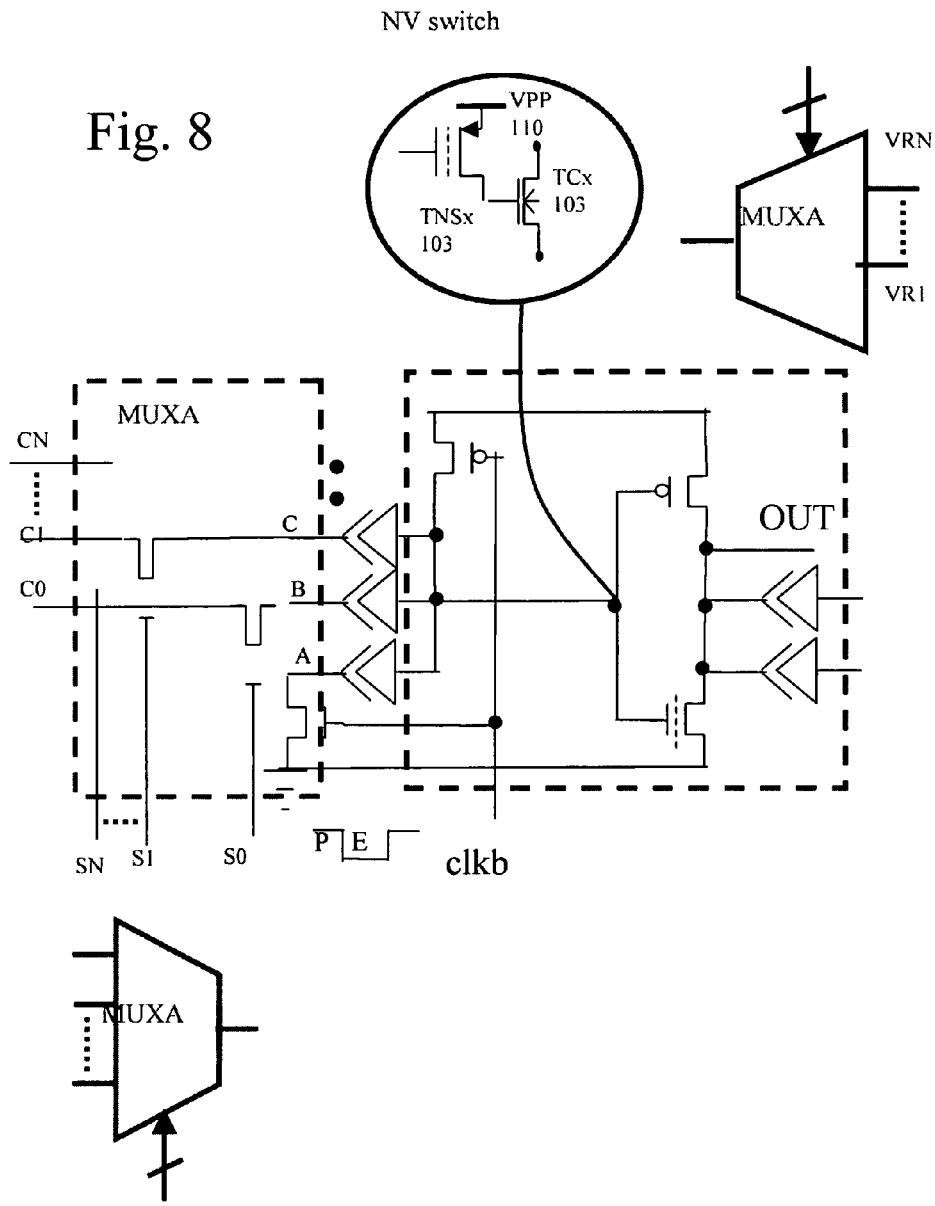
FIG. 8 shows MUX schemes to gate input and output nets in SCL circuits. It also show two schemes to organize IO blocks for a large FPGA device with large number of IO pins.

It can be seen in FIG. 1D that the SCL circuit configuration shown in FIG. 7C is extremely simple comparing to the conventional CMOS-TTL gates. Since the diodes are integrated into the NMOS. The intra and inter gate connections are very little. Therefore this circuit architecture type is highly suitable for FPGA construct since both the Vt adjustments and the final gate formation and interfaces can be handled with small programming facility overhead and less overall wiring resources.

Line Clamping Function

FIG. 7A shows a transmission termination scheme for high speed GHz range PCB nets. Selected IO ports, which sit at the end of long haul daisy chain may be provided with this terminator. The loading effect to the line may be reconfigured as open circuit or clamped termination.

Two embodiment schemes using the NV and pass transistors (defined as NV switches) are proposed. The first is to connect the Schottky diode pair with the overdriven NMOS pass transistor(s). One end connect to the diode, the other end to reference voltage supply. The second scheme is to use the Vt transistor directly. Since the Vt may vary for 4 states, the source drain resistance may vary in a range from open circuit, to enhancement (Kohm), and to depletion mode (<50 ohm) resistance.

Efficient Muxing, Demuxing, and DADT Apparatus

The DTL circuit topology makes it extremely compact in providing wide signal fan-in and fan-out. We can observe this feature in FIG. 7C, as the diodes may have wide input and out channel taping with the common cathode and NMOS source-drains. Besides the various NAND/NOR gate functions, interface connection macros are developed.

TABLE IV

OHMUX truth table
One Hot selector: OHMUX

| Sn | S3 | S2 | S1 | S0 | Vout |
|----|----|----|----|----|------|
| 0  | 0  | 0  | 0  | 1  | C0   |
| 0  | 0  | 0  | 1  | 0  | C1   |
| 0  | 0  | 1  | 0  | 0  | C2   |
| 1  | 0  | 0  | 0  | 0  | CN   |

FIG. 7B shows a input mux scheme, Wherein the macro receives a plural number of digital or analog signals, and output responses according to control input(s). One of the embodiment implementing the One-Hot select function is shown in FIG. 7B. Wherein A bank of simple pass transistors connect the input signal sources to the SCL diode NAND input ports. Mutually exclusive digital selections are activated during the clocking window. Voltage input with one SBD offset is applied to node 1 of the inverter gate. The SCL gate now behalves like a analog comparator. It compares the gate voltage against the stored Vt. If the instant VG is greater than Vt, the inverter will switch and the output resistances will be in several digital ranges. Thus the combines MUX+SCL circuit is characterized as an Analog to Digital Translator. FIG. 7D shows another variation where chains of pass transistors act as AND selector to select desired signals to the comparator. Still another embodiment is to use the small arrays of NV switches for the MUX gate in the comparator.

The NV switches scheme may link to a input state register unit of the programming facility 400 to accommodate charge transport activities to each of the local switch transistor TN1 102 in each of the SCL gates. This, together with the stored software procedures in MLC array block 700, completes the preferred implementation of the charge pump circuitry of the DADT engine. The charge pump works on the Digital to Analog Conversions, while the comparator works on the opposite tasks. The two branches of on chip facility define a shared Digital-Analog-Digital-Translator DADT apparatus.

FIG. 8 summarize the multiplexing means to interconnect signal and apply conditions at various parts, nodes, during reconfiguration procedures. In general, we disclosed several competing methods and apparatus to implement SCL type of FPGA, which enables or alters various functions, controls, electrical device parameters of certain elements, circuit wirings, logic and analog function behaviors of a basic circuit element, large units, and subsystems.

FIG. 9 depicts the core constructs to implement a universal IC with the SFPGA technology. The building blocks are pre-allocated pre-wired inverters, switches, thin film and metal tracks, and large hardwired array blocks. Various chip sets are planned and simulated for their functions, performances, and areas with symbolic and virtual designs. Then we can form controller chips and other slave chips to map out chipsets for various product applications. Chip areas and performance is optimized and determined by the best ratios of pre-wired hardware to the programmable blocks and interconnections.

Two form factors are proposed to layout IO blocks. One uses all IO around the edges FIG. 9B, the other has scattered IO blocks, FIG. 9C. This form has least IO capacitance and inductance, hence shall yield high performance systems. We believe the SFPGA will outperform any IC sub-systems formed by standalone CMOS FPGA, conventional ASIC, and memory parts.

A new scheme of Schottky FPGA (SFPGA) IC solution is disclosed. The chip is organized by embedded analog, memory, and logic units with on chip apparatus and software means to partitioning, altering selected portions of hardware. The process means is based on the combined Schottky CMOS (SCMOS, U.S. Pat. No. 6,590,800) and Flash technology. The circuit means is based on SCMOS-DTL gate arrays. Software means is based on the C++ procedures with levels of LUT. The SFPGA device supports GHZ low power ASIC mixed signal product applications with embedded analog, logic, and memory array units.

Several multiplexing schemes can be implemented, which accommodate tasks for varying the Vt or transmission line termination of selected transistor or IO nets, respectively, and therefore their analog and digital device properties. A Digital-Analog-Digital-Translator DADT apparatus can also be implemented.

The present invention allows for control schemes to field program basic circuit element or any critical nets, and to alter the functionality of certain predetermined circuit units, and update array interconnections, accessing stored protocols, algorithms in all chips in the embodiment subsystem of a SFPGA chip set.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A field programmable gate array (FPGA) circuit comprising:
    a plurality of fixed threshold and variable threshold transistors;
    a plurality of Schottky barrier diodes;
    a plurality of poly silicon film resistors;
    a plurality of capacitors; and
    a plurality of wiring tracks, wherein all of the elements are on a single substrate to form integrated circuits with implementing macro functions, wherein the circuit is software driven, wherein the software includes state tables, virtual machines, setup or initialization and test procedures, data access, transport, and storage algorithms.

2. A field programmable gate array (FPGA) comprising:
    a plurality of fixed threshold and variable threshold transistors;
    a plurality of Schottky barrier diodes;
    a plurality of poly silicon film resistors;
    a plurality of capacitors; and
    a plurality of wiring tracks, wherein all of the elements are on a single substrate to form integrated circuits with implementing macro functions, wherein the circuit is software driven and wherein the at least a portion of the macro functions can be hardwired, wherein the software includes state tables, virtual machines, setup or initialization and test procedures, data access, transport and storage algorithms.

3. A field programmable gate array (FPGA) circuit comprising:
a plurality of fixed threshold and variable threshold transistors;
a plurality of Schottky barrier diodes;
a plurality of poly silicon film resistors;
a plurality of capacitors; and a plurality of wiring tracks, wherein all the elements are on a single substrate to form integrated circuits with implementing macro functions, wherein a part of the elements are user programmed and part of the elements are factory programmable, wherein the circuit is software driven, wherein the software includes state tables, virtual machines, setup or initialization and test procedures, data access, transport, and storage algorithms.

4. A field programmable gate array (FPGA) circuit comprising:
a plurality of fixed threshold and variable threshold transistors;
a plurality of Schottky barrier diodes;
a plurality of poly silicon film resistors;
a plurality of capacitors; and
a plurality of wiring tracks, wherein all of the elements are on a single substrate to form integrated circuits with implementing macro functions, wherein the circuit is hardware driven, wherein the hardware comprises hardwired Schottky CMOS Logic (SCL) gate array and memory units, IO transceivers, Voltage supply doubler and reference generator, and on chip transmission line terminators.

5. A field programmable gate array (FPGA) comprising:
a plurality of fixed threshold and variable threshold transistors;
a plurality of Schottky barrier diodes;
a plurality of poly silicon film resistors;
a plurality of capacitors; and
a plurality of wiring tracks, wherein all of the elements are on a single substrate to form integrated circuits with implementing macro functions, wherein the circuit is hardware driven, wherein the hardware comprises hardwired Schottky CMOS Logic (SCL) gate array and memory units, IO transceivers, and terminators.

6. A field programmable gate array (FPGA) circuit comprising:
a plurality of fixed threshold and variable threshold transistors;
a plurality of Schottky barrier diodes;
a plurality of poiy silicon film resistors;
a plurality of capacitors; and a plurality of wiring tracks, wherein all the elements are on a single substrate to form integrated circuits with implementing macro functions, wherein a part of the elements are user programmed and part of the elements are factory programmable, wherein the circuit is hardware driven, wherein the hardware comprises hardwired Schottky CMOS Logic (SCL) gate array and memory units, IO transceivers, and terminators.

7. The field programmable gate array (FPGA) circuit of claim 1 wherein software is provided to adjust the threshold of the variable threshold transistors.

8. The field programmable gate array (FPGA) circuit of claim 1 wherein software is provided to form reconfigurable logic gate array circuit units.

9. The field programmable gate array (FPGA) circuit of claim 1 wherein software is provided to complete certain network connections among various units in the single diagram.

10. The field programmable gate array (FPGA) circuit of claim 1 wherein the Schottky barrier diodes comprise a PN junction diode if SOI GaAs technologies are used.

11. The field programmable gate array (FPGA) circuit of claim 1 wherein the Schottsky barrier diode can be coupled to input pads for Electrical Static Discharge protection.

12. The field programmable gate array (FPGA) circuit of claim 1 wherein the schottsky barrier diode can be coupled to the well for Latch-up suppression.

13. The field programmable gate array (FPGA) circuit of claim 1 wherein the schottsky barrier diode can be coupled to control the well biasing potential, therefore change I–V characteristics of CFETs within the well region with circuit operating conditions.

14. The field programmable gate array (FPGA) circuit of claim 1 wherein a mechanism is provided to adjust the threshold of a distribution variable threshold transistor.

15. The field programmable gate array (FPGA) circuit of claim 7 wherein the Schottky barrier diodes are adaptable to other product applications including but not limited to DRAM, Flash, CAM, PLD, ROM, and embedded ASICs.

16. The field programmable gate array (FPGA) of claim 2 wherein software is provided to adjust the threshold of the variable threshold transistors.

17. The field programmable gate array (FPGA) of claim 2 wherein software is provided to form reconfigurable logic gate array circuit units.

18. The field programmable gate array (FPGA) of claim 2 wherein software is provided to complete certain network connections among various units in the single diagram.

19. The field programmable gate array (FPGA) circuit of claim 2 wherein a mechanism is provided to adjust the threshold of a distribution variable threshold transistor.

20. The field programmable gate array (FPGA) circuit of claim 3 wherein software is provided to adjust the threshold of the variable threshold transistors.

21. The field programmable gate array (FPGA) circuit of claim 3 wherein software is provided to form reconfigurable logic gate array circuit units.

22. The field programmable gate array (FPGA) circuit of claim 3 wherein software is provided to complete certain network connections among various units in the single diagram.

23. The field programmable gate array (FPGA) circuit of claim 3 wherein a mechanism is provided to adjust the threshold of a distribution variable threshold transistor.

24. The field programmable gate array (FPGA) circuit of claim 4 wherein the hardware comprises software driven SCL gate arrays, IO transceivers, terminators, capacitors and wherein a switching transistor is of Variable Threshold type.

25. The field programmable gate array (FPGA) circuit of claim 4 which includes software driven SCL gate arrays, IO transceivers, terminators, capacitors, wherein the switching transistor is of Variable Threshold type, and the SCL unit act as analog signal comparator.

26. The field programmable gate array (FPGA) circuit of claim 4 which includes software driven SCL gate arrays, IO transceivers, terminators, capacitors, wherein the switching transistor is of Variable Threshold type, and the SCL gate may perform a nonvolatile latch function.

27. The field programmable gate array (FPGA) circuit of claim 4 which includes software driven SCL gate arrays, IO transceivers, terminators, capacitors, wherein the switching transistor is of Variable Threshold type, and the SCL unit may process multi-value logic operation with binary, ternary and quaternary operators.

28. The field programmable gate array (FPGA) circuit of claim 4 which includes software driven CMOS-TTL gate arrays, IO transceivers, terminators and capacitors.

29. The field programmable gate array (FPGA) circuit of claim 4 which includes hardwired conventional logic and memory units including but not limited to CMOS-TTL gate arrays, Register files, embedded RAM, ROM and Flash cores.

30. The field programmable gate array (FPGA) circuit of claim 4 which includes dedicated programming facilities of voltage and current sources, clock and oscillators, state machines and counters, to implement and control both cell wise and block wise cell operations and which is shared to alter the charge storage or Variable Threshold of the selected device(s) in the logic and (Flash) memory circuitry.

31. The field programmable gate array (FPGA) of claim 4 wherein the analog signal comparator includes a pass transistor for sampling reference messages.

32. The field programmable gate array (FPGA) of claim 5 wherein the hardware comprises software driven SCL gate arrays, IO transceivers, terminators, capacitors and wherein a switching transistor is of Variable Threshold type.

33. The field programmable gate array (FPGA) of claim 5 which includes software driven SCL gate arrays, IO transceivers, terminators, capacitors, wherein the switch transistor is of Variable Threshold type, and the SCL unit act as analog signal comparator.

34. The field programmable gate array (FPGA) of claim 5 which includes software driven SCL gate arrays, JO transceivers, terminators, capacitors, wherein the switching transistor is of Variable Threshold type, and the SCL gate may perform a nonvolatile latch function.

35. The field programmable gate array (FPGA) of claim 5 which includes software driven SCL gate arrays, IO transceivers, terminators, capacitors, wherein the switching transistor is of Variable Threshold type, and the SCL unit may process multi-value logic operation with binary, ternary and quaternary operators.

36. The field programmable gate array (FPGA) of claim 5 which includes software driven CMOS-TTL gate arrays, IO transceivers, terminators and capacitors.

37. The field programmable gate array (FPGA) of claim 5 which includes hardwired conventional logic and memory units including but not limited to CMOS-TTL gate arrays, Register files, embedded RAM, ROM and Flash cores.

38. The field programmable gate array (FPGA) of claim 5 which includes dedicated programming facilities of voltage and current sources, clock and oscillators, state machines and counters, to implement and control both cell wise and block wise cell operations and which is shared to alter the charge storage or variable threshold of the selected device(s) in the logic and (Flash) memory circuitry.

39. The field programmable gate array (FPGA) circuit of claim 5 wherein the analog signal comparator includes a pass transistor for sampling reference messages.

40. The field programmable gate array (FPGA) circuit of claim 6 wherein the hardware comprises software driven SCL gate arrays, IO transceivers, terminators, capacitors and wherein a switching transistor is of Variable Threshold type.

41. The field programmable gate array (FPGA) circuit of claim 6 which includes software driven SCL gate arrays, IO transceivers, terminators, capacitors, wherein the switching transistor is of Variable Threshold type, and the SCL unit act as analog signal comparator.

42. The field programmable gate array (FPGA) circuit of claim 6 which includes software driven SCL gate arrays, IO transceivers, terminators, capacitors, wherein the switching transistor is of Variable Threshold type, and the SCL gate may perform a nonvolatile latch function.

43. The field programmable gate array (FPGA) circuit of claim 6 which includes software driven SCL gate arrays, IO transceivers, terminators, capacitors, wherein the switching transistor is of Variable Threshold type, and the SCL unit may process multi-value logic operation with binary, ternary and quaternary operators.

44. The field programmable gate array (FPGA) circuit of claim 6 which includes software driven CMOS-TTL gate arrays, IO transceivers, terminators and capacitors.

45. The field programmable gate array (FPGA) circuit of claim 41 wherein the analog signal comparator includes a pass transistor for sampling reference messages.

* * * * *